United States Patent [19]
Fujimori

[11] 4,164,843
[45] Aug. 21, 1979

[54] METALLIC LEAD PLATE AND CIRCUIT STRUCTURE FOR AN ELECTRONIC WATCH AND METHOD OF ASSEMBLY

[75] Inventor: Motoyuki Fujimori, Suwa, Japan

[73] Assignee: Kabushiki Kaisha Suwa Seikosha, Tokyo, Japan

[21] Appl. No.: 839,866

[22] Filed: Oct. 6, 1977

[30] Foreign Application Priority Data

Oct. 6, 1976 [JP] Japan ............................ 51/134475

[51] Int. Cl.² ............................................ G04B 37/00
[52] U.S. Cl. .................................. 58/23 R; 58/88 R;
29/179; 361/421
[58] Field of Search .......... 58/23 R, 53, 88 R, 23 BA;
29/177, 179; 361/421

[56] References Cited
U.S. PATENT DOCUMENTS

| 3,784,725 | 1/1974 | Perkins | 58/23 R |
| 3,945,196 | 3/1976 | Wood | 58/50 R |
| 3,983,689 | 10/1976 | Burke | 58/23 R |
| 3,986,335 | 10/1976 | Harper | 58/23 BA |
| 4,045,953 | 9/1977 | Miyazaki | 58/23 R |
| 4,086,696 | 5/1978 | Ikuta | 29/177 |

Primary Examiner—J. V. Truhe
Assistant Examiner—William L. Feeney
Attorney, Agent, or Firm—Blum, Moscovitz, Friedman & Kaplan

[57] ABSTRACT

A circuit structure for an electronic watch including a metallic lead plate which is overlapped on a circuit base plate and circuit case is provided. The metallic lead plate and circuit base plate are formed with receiving openings in regions of the circuit base plate requiring electrical connections and electronic elements for receiving projections formed on the circuit case for securing the lead plate and circuit base plate to the circuit case. The circuit base plate and circuit case are formed with cutting openings corresponding to portions of the lead plate to be cut through the cutting openings whereby the unsecured portion of the lead plate may be removed.

7 Claims, 3 Drawing Figures

METALLIC LEAD PLATE AND CIRCUIT STRUCTURE FOR AN ELECTRONIC WATCH AND METHOD OF ASSEMBLY

BACKGROUND OF THE INVENTION

This invention relates generally to a circuit structure for an electronic device, and in particular to an electronic wristwatch having a metallic lead plate overlaid on a circuit base plate and a method of assembly.

In order to attain the greatest efficiency in automation in the manufacture of electronic wristwatches employing MOS-IC circuits and a circuit base plate having a thin film circuit deposited thereon, automatic tape carrier assembly systems has been adopted. While this method of assembly has proved satisfactory to some extent, circuit elements must be secured to the circuit base plate which has insufficient strength to support the circuit elements. It has been difficult to insert the circuit elements and circuit base plate into the wristwatch body and the circuit elements are normally fixed to the circuit base plate by soldering. In view of this procedure, it is inevitable to have defects in assembly due to the large number of assembly operations.

Accordingly, it would be desirable to provide an electronic wristwatch circuit structure of sufficient strength to support circuit elements and eliminate the need of a large number of independent soldering operations.

SUMMARY OF THE INVENTION

Generally speaking, in accordance with the invention, a circuit structure for an electronic watch is provided. The circuit structure includes a circuit base plate having a thin film type wristwatch circuit deposited thereon. The circuit base plate is formed with a plurality of receiving openings and cutting openings in the region where electrical connections for electric wristwatch circuit elements are required. A unitary metallic lead plate formed to cover at least a portion of the circuit base plate in the connection region is formed with receiving openings to register with the receiving openings formed in the circuit base plate. A wristwatch circuit case supporting member is formed with a plurality of projections equal in number and positioned to register with the receiving openings formed in the circuit base plate and lead plate.

The lead plate is positioned on the circuit base plate and positioned over the circuit case with the projections in registration with the receiving openings. The circuit base plate and lead plate are secured to the circuit case by deforming the projections thereby securing lead plate to circuit base plate in the connection regions. Unsecured and excess portions of the lead plate are removed by cutting through cutting openings provided in the circuit base plate and circuit case. By constructing and arranging an electronic wristwatch circuit assembly in this manner, a thin structurally sound electric watch may be obtained which requires a fewer number of individual assembly operations, such as soldering and the like.

Accordingly, it is an object of the invention to provide an improved circuit structure for an electronic wristwatch.

Another object of the invention is to provide an improved circuit structure including a metallic lead plate.

A further object of the invention is to provide an improved circuit structure wherein a metallic lead plate is secured to a circuit base plate and circuit case by projections formed on the circuit case.

Still another object of the invention is to provide an improved circuit structure wherein a metallic lead plate is included and unnecessary portions may be removed by cutting during assembly.

Another object of the invention is to provide an improved method of assembly for a circuit structure including a metallic lead plate.

Yet a further object of the invention is to provide an improved lead plate for use in an electronic wristwatch including a circuit base plate.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
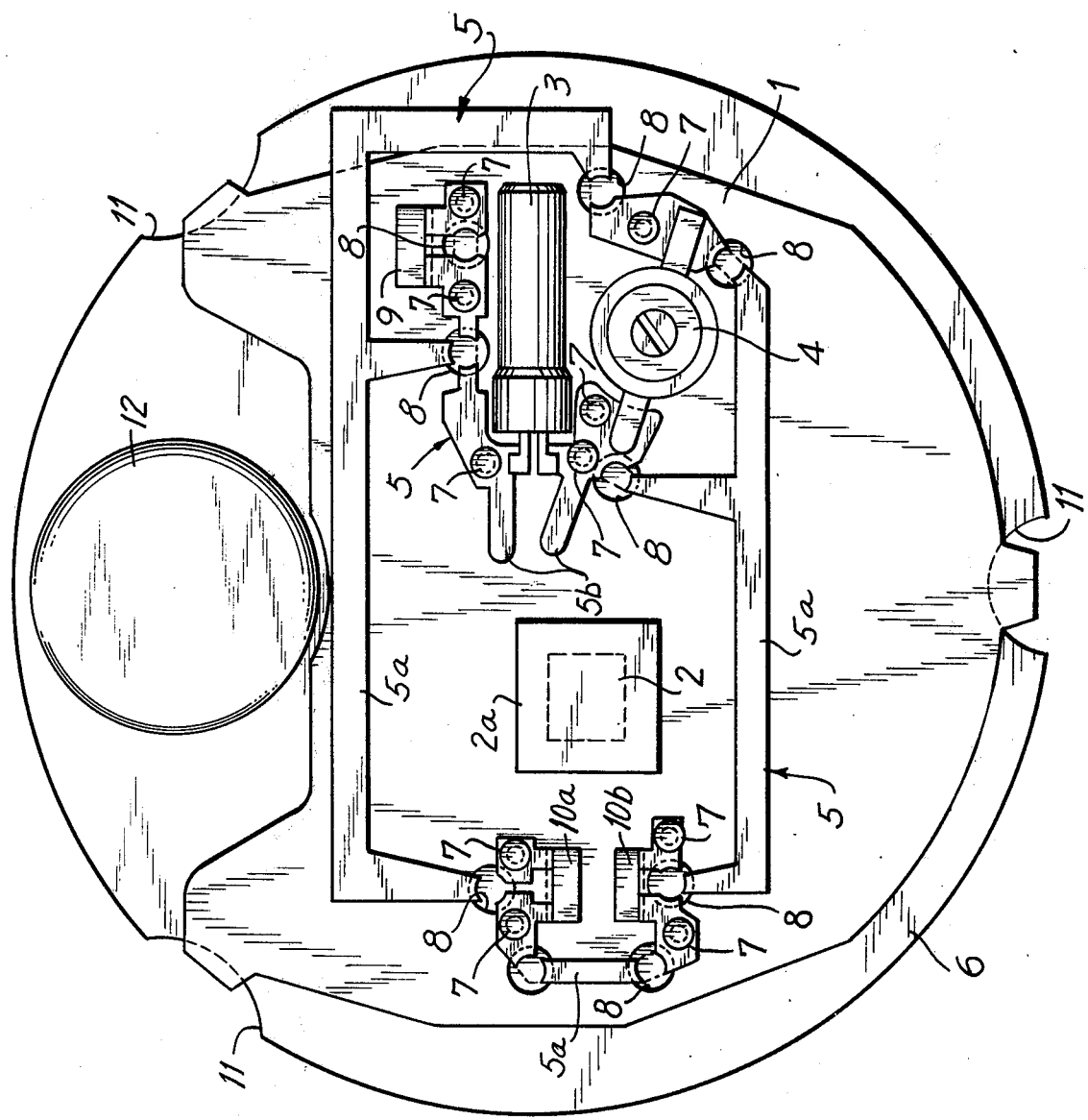
FIG. 1 is a plan view of a portion of an electronic wristwatch circuit structure constructed and arranged in accordance with the invention illustrating the lead plate overlaid on the circuit base plate, but prior to removal of the unnecessary portions thereof.

Referring now to FIG. 1, a plan view of the circuit structure of an electronic wristwatch constructed and arranged in accordance with the invention is shown. The figure illustrates metallic lead plate shown generally as 5 prior to removal of the unnecessary portions as will be described more fully below with respect to the method of assembly of the circuit structure.

A circuit base plate 1 having a thin film electric wristwatch circuit deposited thereon (not shown) is formed with a plurality of receiving openings 7a selectively located in the region surrounding the circuit electronic components. Circuit base plate 1 also is formed with a plurality of cutting openings 8 selectively located in the region of receiving openings 7a to permit cutting and removal of unnecessary portions 5a of lead plate 5.

Lead plate 5 is formed from a metallic material and adapted to register with certain portions of circuit base plate 1 requiring electrical connection and various electronic components to be bonded thereto. Lead plate 5 is also formed with securing projections 5b for securing circuit base plate 1 to circuit case 6. Lead plate 5 is formed with a plurality of receiving openings 7b to register with receiving openings 7a formed in circuit base plate 1. Location of openings 7a and securing projections are predetermined to be at locations requiring electrical connection or support from lead plate 5.

A circuit case 6 of a non-conductive material, such as a plastic resin, is formed with a plurality of projecting dowels 7 to register with receiving openings in lead plate 5. Circuit case 6 provides support for circuit base plate 1 and lead plate 5.

Prior to assembling the circuit structure, a quartz oscillator unit 3 and a trimmer condenser 4 are welded to lead plate 5 at appropriate predetermined locations. The circuit structure is assembled as follows.

A MOS-IC chip 2 is gang bonded to circuit base plate 1 and encapsulated in a resin 2a to protect chip 2 from damage during assembly or use of the wristwatch. Circuit base plate 1 having chip 2 bonded thereto is positioned on circuit case 6 causing projecting dowels 7 to register with receiving openings 7a formed in circuit base plate 1. Lead plate 5 which has fixed thereto quartz oscillator unit 3 and trimmer condenser 4 is positioned across a portion of a circuit plate 1 with receiving openings 7b registering with dowels 7 and overlapping cutting openings 8 in circuit base plate 1 and circuit case 6. Lead plate 5, circuit base plate 1 and circuit case 6 are then formed into a unitary circuit structure by deforming projecting dowels 7. This deformation may be by pressure, thermal caulking or the like. Outer edges of circuit base plate 1 are trimmed at a notch 11 provided in circuit case 6.

Unnecessary portions 5a of lead plate 5, that is the unsecured regions between adjacent cutting openings 8 are removed by cutting through cutting openings 8 formed in circuit base plate 1 and circuit case 6. When the circuit structure is assembled in this manner, an regulating condenser 9 of the quartz oscillator circuit is positioned into a concave portion of circuit case 6 and abuts lead plate 5. Two boosting condensers 10a and 10b for a display driving circuit, such as liquid crystal driving circuits are similarly positioned into a concave portion of circuit case 6 abutting lead plate 5. Electrical connections are completed by biasing action of lead plate 5 against the electronic elements. Securing projection 5b of lead plate 5 provide a biasing force against circuit base plate 1 thereby securing it to circuit case 6 for reinforcement.

Figure 2:
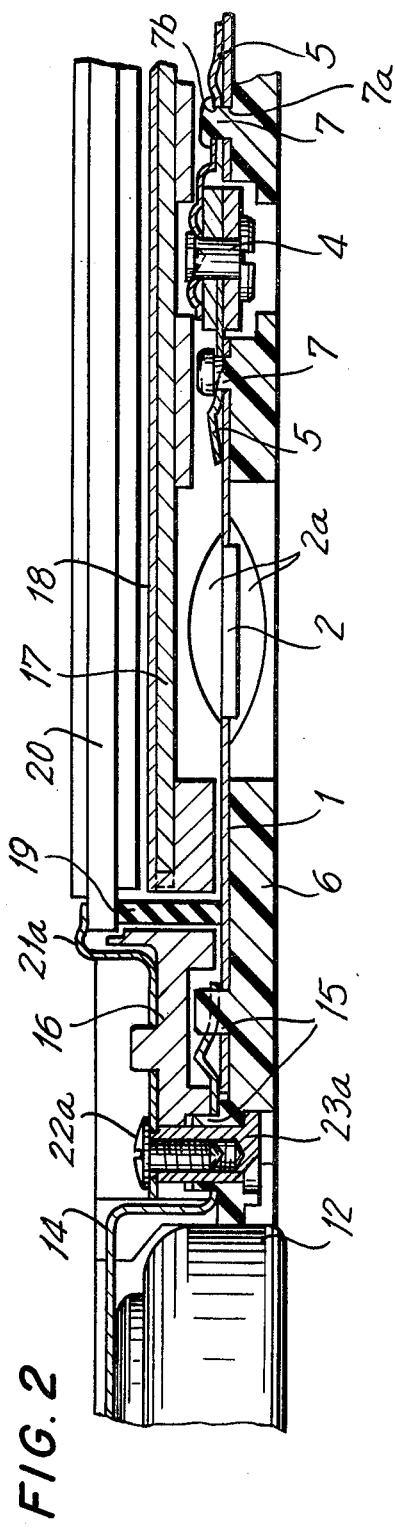
FIG. 2 is a cross-sectional view of an electronic wristwatch concluding a circuit structure constructed and arranged in accordance with the invention.
Figure 3:
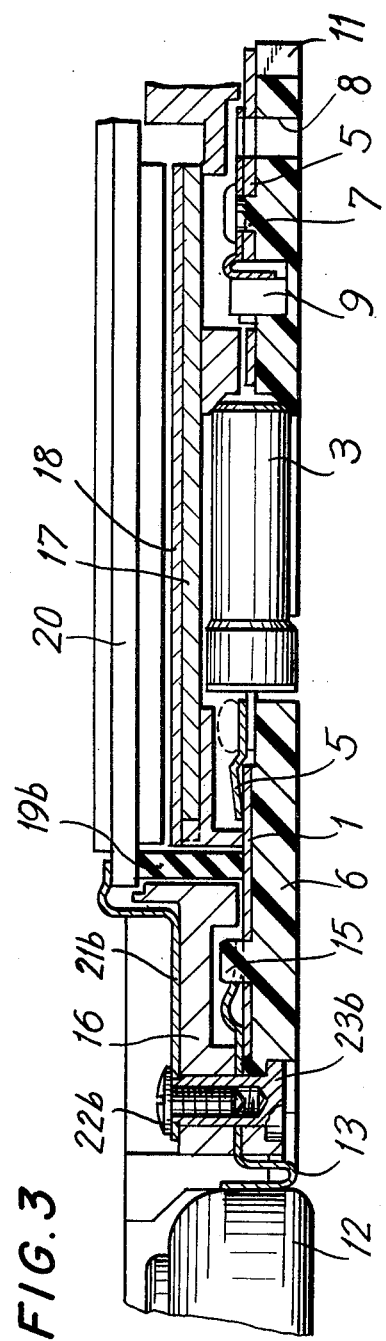
FIG. 3 is another sectional view of the wristwatch of FIG. 2.

Referring now to FIGS. 2 and 3, a positive lead 13 and a negative lead 14 for completing the circuit are positioned and secured by a guide projection 15 formed in circuit case 6. Leads 13 and 14 are maintained in position by a panel receiving seat 16 which is secured by panel arresters 21a and 21b. Panel arresters 21a and 21b are secured to circuit case 6 by means of screws 22a and 22b which are screwed into two receiving legs 23a and 23b mounted into circuit case 6. A battery 12 for providing the electromotive force for driving the circuit is positioned in circuit case 6 with its electrodes contacting the corresponding leads 13 and 14.

A display area, such as a liquid crystal display panel 20 may be utilized in an electric wristwatch constructed and arranged in accordance with the invention. In the embodiment wherein liquid crystal display 20 is utilized, a reflection plate 17 and a lower polarization plate 18 are inserted between panel 20 and the circuit structure. Two elastic conductive members 19a and 19b are compressed between liquid crystal panel 20 and circuit base plate 1 by means of panel arresters 21a and 21b for providing electrical connection through liquid crystal panel 20.

Accordingly, by constructing and arranging an electronic wristwatch circuit structure in accordance with the invention, wherein the electrical connections between circuit base plate 1 and lead plate 5 is obtained by utilizing the biasing force of lead plate 5 against the circuit pattern formed on circuit base plate 1, it is possible to obtain electrical contact by means of pressure and thermal caulking. A thinner wristwatch of excellent design results. In addition, the method of assembly of the invention permits use of an automatic tape carrier assembly system eliminating many individual soldering operations. Moreover, by using mechanical processes such as welding, thermal caulking, pressing in and the like an improved assembly and working reliability results when compared to wristwatches assembled in the conventional manner using soldering. Furthermore, a substantial reduction in cost is obtained. The inserted electronic components held by biasing action of the lead plate may also be replaced easily when servicing the wristwatch.

In another embodiment of the invention, the cutting of outer portion of circuit base plate 1 may be accomplished at the completion of assembly of the watch body. In addition, quartz oscillator unit 5 and trimmer condenser 4 may be secured by welding to lead plate 5 after securing lead plate 5 to circuit base plate 1 and circuit case 6.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electronic wristwatch comprising a watch case means formed with at least one opening, circuit structure means received in said watch case means, said circuit structure means comprising circuit base plate means having a thin film circuit deposited thereon and formed with at least one receiving opening and at least one cutting opening in a region of said circuit requiring electrical connection; lead plate means in registration with said circuit base plate means and adapted to provide said electrical connections, said lead plate means formed with at least one receiving opening to register with said circuit base plate means receiving opening and circuit case reinforcing means in registration with said circuit base plate means and formed with at least one projection in cooperation with said receiving openings formed in said circuit base plate means and lead plate means for securing said lead plate means and said circuit base plate means to said reinforcing means.

2. The wristwatch of claim 1, wherein said lead plate means is formed from a unitary sheet of metallic material secured to said circuit base plate means overlying said at least one cutting opening and defined by a cut at the region overlying said cutting opening.

3. A digital display electronic wristwatch comprising watch case means formed with at least one opening, circuit structure means received in said watch case means opening, said circuit structure means including circuit base means having a thin film watch circuit deposited thereon, said circuit base means formed with a plurality of receiving openings and a plurality of cutting openings therethrough in predetermined spaced apart regions of said circuit requiring electrical connections;

lead plate means in registration with said circuit base means formed from a sheet of metallic material in a predetermined shape adapted to provide said electrical connections, said lead plate means formed with a plurality of receiving openings to register with said circuit base means receiving openings; and circuit case means in registration with said circuit base means formed with a plurality of projections adapted to register with said receiving openings formed in said circuit base plate and lead plate, said lead plate and circuit base plate secured over said circuit case means by deforming said projection to secure said lead plate means and said circuit case means and to provide electrical connections between said circuit base means and electrical components.

4. The wristwatch of claim 3, including a liquid crystal display means, circuit chip means bonded to said circuit base plate means, quartz oscillator means and trimmer condenser means welded to said lead plate, regulating condenser means and boosting condenser means mounted in circuit structure means so as to be biased by said lead plate, and elastic conductive means compressed between said display means and said circuit base means for providing electrical connection to said display means.

5. The wristwatch of claim 3, wherein said lead plate means is formed from a unitary sheet of metallic material defined by a cut at each region overlying said cutting openings.

6. The wristwatch of claim 3, wherein said lead plate means includes securing projections for biasing said circuit base plate means against said circuit case means.

7. The wristwatch of claim 3, wherein said display means is a liquid crystal display panel.

* * * * *